(12) United States Patent
Hossack et al.

(10) Patent No.: US 7,719,362 B2
(45) Date of Patent: May 18, 2010

(54) PROGRAMMABLE-GAIN AMPLIFIER SYSTEMS TO FACILITATE LOW-NOISE, LOW-DISTORTION VOLUME CONTROL

(75) Inventors: David M. Hossack, Somerville, MA (US); Rama Thakar, Medford, MA (US); Robert Adams, Acton, MA (US); Joseph Burke, Wilmington, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 12/286,662

(22) Filed: Sep. 30, 2008

(65) Prior Publication Data

US 2009/0091390 A1 Apr. 9, 2009

Related U.S. Application Data

(60) Provisional application No. 60/997,676, filed on Oct. 3, 2007.

(51) Int. Cl.
*H03G 3/12* (2006.01)
(52) U.S. Cl. .................................... 330/282; 330/86
(58) Field of Classification Search ................ 330/282, 330/284, 86, 291, 109, 254
See application file for complete search history.

(56) References Cited

U.S. PATENT DOCUMENTS

| | | | |
|---|---|---|---|
| 5,598,158 A | 1/1997 | Linz | 341/148 |
| 5,896,291 A | 4/1999 | Hewitt et al. | 364/400.01 |
| 5,920,843 A | 7/1999 | Fay | 704/503 |
| 6,198,349 B1 | 3/2001 | Kanno et al. | 330/282 |
| 6,256,395 B1 | 7/2001 | Melanson | 381/312 |
| 6,577,910 B1 | 6/2003 | Eastty et al. | 700/94 |
| 6,583,347 B2 | 6/2003 | Tamura | 84/603 |

(Continued)

FOREIGN PATENT DOCUMENTS

JP 58194112 A 11/1983

(Continued)

OTHER PUBLICATIONS

PCT Notification of the International Search Report and the Written Opinion of the International Searching Authority, Dated Jan. 19, 2009; for International Application No. PCT/US2008/011477.

(Continued)

*Primary Examiner*—Robert Pascal
*Assistant Examiner*—Hieu P Nguyen
(74) *Attorney, Agent, or Firm*—Koppel, Patrick, Heybl & Dawson (57) ABSTRACT

Programmable-gain amplifier systems are provided that are particularly suited for reducing degrading audio effects such as zipper noise. In one embodiment, these systems switchably couple an electronic potentiometer between an amplifier's inverting input terminal and interleaved tap points along a resistor that is coupled to the amplifier's output terminal. This arrangement introduces a number of fine gain steps between the gain steps that are realized with adjacent ones of the interleaved tap points to substantially reduce or eliminate zipper noise in a audio system that processes the system's output signal. The interleaved tap points facilitate efficient operation of the potentiometer during gain changes. They also permit the potentiometer to be effectively bypassed between gain changes so that distortion effects are substantially eliminated.

17 Claims, 5 Drawing Sheets

U.S. PATENT DOCUMENTS

| | | | | |
|---|---|---|---|---|
| 6,661,900 | B1 | 12/2003 | Allred et al. | 381/103 |
| 6,892,103 | B1 | 5/2005 | Allred et al. | 700/94 |
| 6,898,470 | B1 | 5/2005 | Rao et al. | 700/94 |
| 7,158,843 | B2 | 1/2007 | Smith | 700/94 |
| 2003/0044027 | A1 | 3/2003 | Tsuji et al. | |
| 2008/0061872 | A1* | 3/2008 | Hughes | 330/86 |

FOREIGN PATENT DOCUMENTS

| | | |
|---|---|---|
| WO | WO 8809581 | 12/1988 |

OTHER PUBLICATIONS

Israelsohn, Joshua, "Gain Control", EDN Magazine, Aug. 8, 2002, 6 pages.

Li, Alan, "Digital Volume Control Eliminates Zipper Noise", ED Online, ID#12376, Apr. 2006, 2 pages.

Zumbahlen, Hank, "Tack a Log Taper Onto a Digital Potentiometer", EDN Magazine, Jan. 20, 2000.

* cited by examiner

PROGRAMMABLE-GAIN AMPLIFIER SYSTEMS TO FACILITATE LOW-NOISE, LOW-DISTORTION VOLUME CONTROL

CROSS REFERENCES TO RELATED APPLICATIONS

This application claims the benefit of U.S. Provisional Application Ser. No. 60/997,676 filed Oct. 3, 2007.

BACKGROUND OF THE INVENTION

1. Field of the Invention

The present invention relates generally to programmable-gain amplifiers.

2. Description of the Related Art

Audio volume controllers often generate objectionable noises due to quantized gain increments. For example, "Zipper noise" manifests itself as a succession of annoying audio clicks or pops (ergo, the term zipper noise). By their nature, analog-based systems produce analog signals that smoothly transition between different amplitude levels and do not, therefore, exhibit zipper noise. Because of the nature of digital signals/systems, a quantized gain jump can generate zipper noise.

BRIEF SUMMARY OF THE INVENTION

The present invention is generally directed to simple programmable-gain amplifier systems that enable low-noise, low-distortion volume control. The drawings and the following description provide an enabling disclosure and the appended claims particularly point out and distinctly claim disclosed subject matter and equivalents thereof.

DETAILED DESCRIPTION OF THE INVENTION

Figure 1:
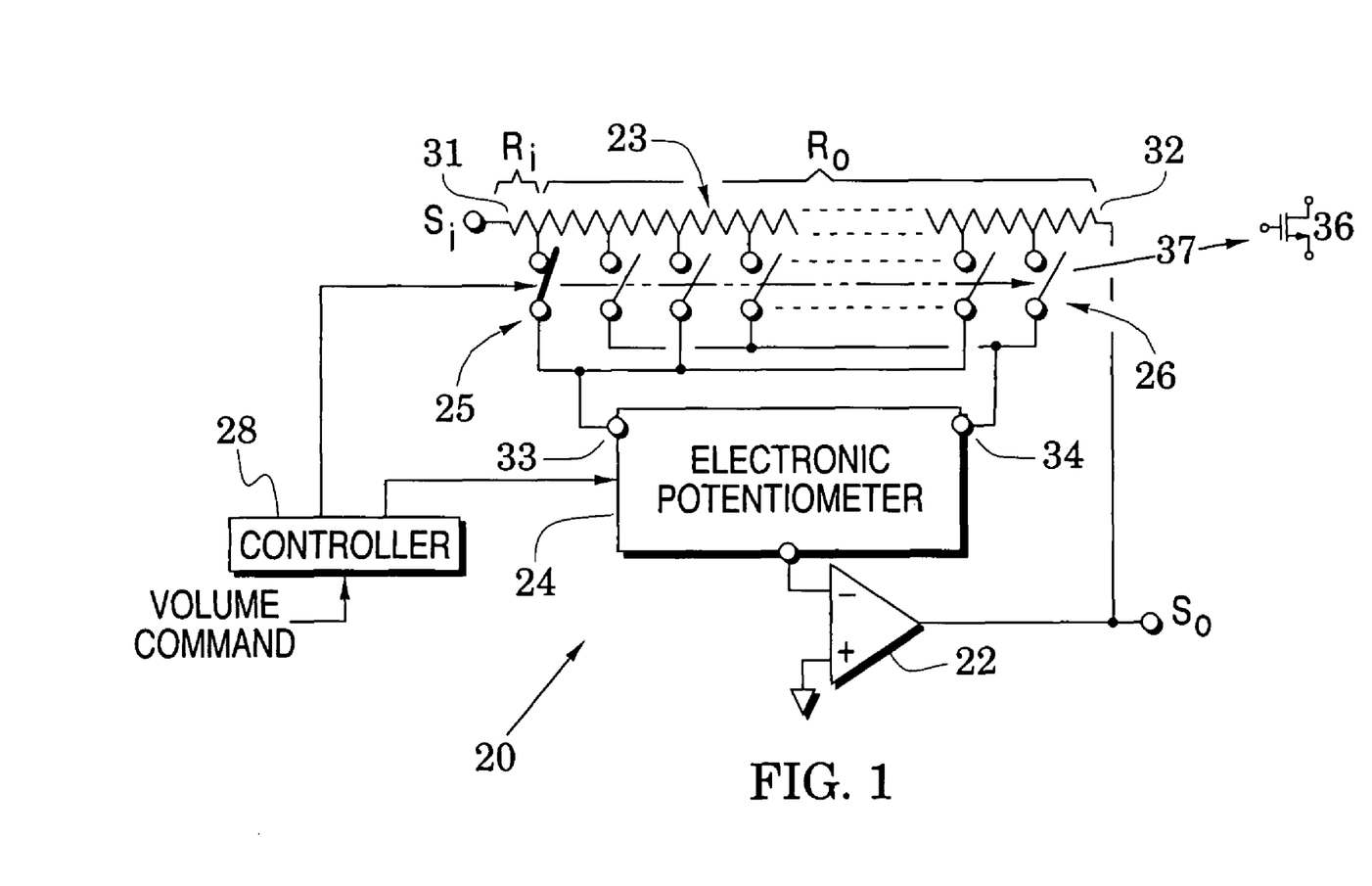
FIG. 1 is a schematic of a programmable-gain amplifier embodiment that includes an electronic potentiometer.

FIG. 1 illustrates a programmable-gain amplifier system 20 that is particularly suited to reduction of degrading audio effects such as zipper noise. The system switchably couples an electronic potentiometer between an amplifier's inverting input terminal and interleaved tap points along a resistor that is coupled to the amplifier's output terminal. This arrangement introduces a number of fine gain steps between the gain steps that are realized with adjacent ones of the interleaved tap points to substantially reduce or eliminate zipper noise in a audio system that processes the system's output signal. The interleaved tap points facilitate efficient operation of the potentiometer during gain changes. They also permit the potentiometer to be effectively bypassed between gain changes so that distortion effects are substantially eliminated.

In particular, FIG. 1 illustrates a programmable-gain amplifier (PGA) system 20 that includes an amplifier 22, a resistor 23, an electronic potentiometer 24, a first set 25 of switches, a second set 26 of switches, and a controller 28. The amplifier has an output terminal (i.e., port) whose voltage is responsive to a potential difference between the amplifier's inverting input terminal and the amplifier's non-inverting input terminal which is connected to virtual ground. The resistor has an input end 31 to receive an input signal $S_i$ and has an output end 32 that is connected to the amplifier's output terminal to receive an output signal $S_o$.

The electronic potentiometer 24 is configured to respond to control signals from the controller 28 and provide selectable first and second resistances respectively between first and second potentiometer ports 33 and 34 and the amplifier's inverting input terminal. Each switch of the first set 25 is coupled between the first potentiometer port 33 and a respective one of first tap points along the resistor 23. In a similar manner, each switch of the second set 26 is coupled between the second potentiometer port 34 and a respective one of second tap points along the resistor 23.

Although they can be arranged differently in other amplifier embodiments, the first and second tap points are interleaved in the embodiment 20 of FIG. 1 (i.e., first and second tap points alternate along the resistor 23). The first and second sets of switches also respond to control signals from the controller 28. Accordingly, the signal gain $S_o/S_i$ is responsive to a volume command applied to the controller 28.

At this point, it is noted that the high gain of the amplifier 22 causes the potential of its inverting input terminal to be at virtual ground and the high input impedance of the amplifier means that it essentially draws no current through the electronic potentiometer 24 nor the first and second sets 25 and 26 of switches. In FIG. 1, a leftmost one of the first set 25 of switches is shown with a heavy line to call attention that it is set in the closed position while all other switches are in the open position. This leftmost switch is also, at this time, directly coupled through the electronic potentiometer to the amplifier's inverting input terminal.

As indicated in FIG. 1, the resistor 23 is therefore divided into an input resistor $R_i$ between the input signal $S_i$ and the inverting input terminal and an output resistor $R_o$ between the inverting input terminal and the amplifier's output terminal. Because $R_o$ is presently substantially greater than $R_i$, The gain of the amplifier is thus determined by the ratio $R_o/R_i$ and is at its highest state (although not shown, the gain has a negative sign because of current flow through the resistors $R_i$ and $R_o$).

In response to signals from the controller 28, one of the switches of the first or second sets 25 and 26 which is closed can be opened and an adjacent switch closed so that the closed position can progress from the leftmost switch to the rightmost switch. Each progression reduces the ratio $R_o/R_i$ so that the gain of the system controllably progresses downward to a minimum gain. In the absence of other system structure, these gain steps may be of sufficient magnitude to induce zipper noise in an audio network that includes the system 20. Between each gain step, however, the electronic potentiometer 24 selectively alters the first and second resistances that are located respectively between the first and second potentiometer ports 33 and 34 and the amplifier's inverting input terminal. This alteration of the first and second resistance provides a plurality of intermediate gain steps between those that are provided by the first and second sets 25 and 26 of switches.

Figure 2A:
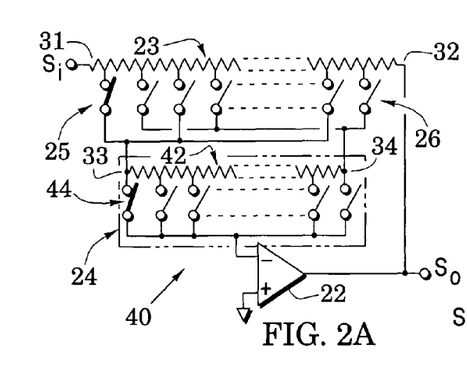
FIGS. 2A-2C are schematics that illustrate exemplary gain steps in an amplifier embodiment that includes an embodiment of the potentiometer of FIG. 1.
Figure 2B:
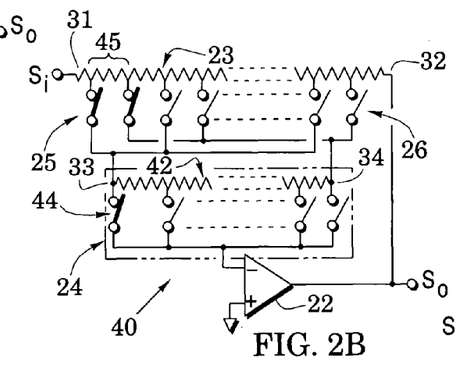
Figure 2C:
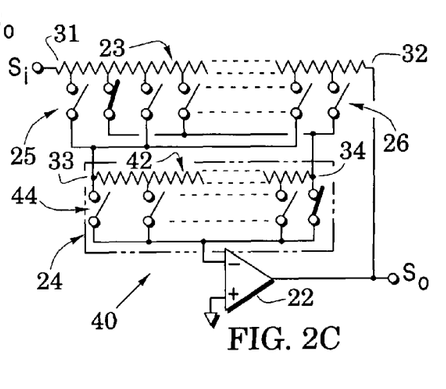

Accordingly, the gain of the system 20 reduces smoothly in a large number of small steps to thereby effectively prevent zipper noise. It is noted that each of the switches of the first and second sets 25 and 26 may, in an embodiment of the system 20, be realized with a transistor 36 as indicated in FIG. 1 by a realization arrow 37. Attention is now directed to FIGS. 2A-2C for an introduction to another system embodiment.

FIG. 2A illustrates a system 40 that includes like elements of the system 20 of FIG. 1 with like elements indicated by like reference numbers. In this system embodiment, the electronic potentiometer 24 is realized with a second resistor 42 coupled between the first and second potentiometer ports 33 and 34 and with a third set 44 of switches that are each coupled between a respective one of third tap points along the second resistor and the inverting input terminal of the amplifier 22.

FIGS. 2A-2C illustrate three exemplary settings of switch positions. In FIG. 2A, a switch nearest the input end 31 is closed and the remaining switches of the first set 25 are open as are all of the switches of the second set 26. The switch of the third set 44 nearest the first potentiometer port 33 is closed and the remaining switches of this set are open. FIG. 2B differs only in that the leftmost of the switches of the second set 26 has been closed. Finally, all of the switches of the first set 25 are open in FIG. 2C as are all of the switches of the second set 26 except the switch nearest the input end 31 which is closed. In the third set 44, the switch nearest the second potentiometer port 34 is closed and the remaining switches of the third coupler are open.

In FIG. 2A, the amplifier's inverting input terminal is coupled to the resistor 23 through the leftmost switches of the first and third sets 25 and 44 so that the gain of the system 20 is at a maximum. In FIG. 2C, the amplifier's inverting input terminal is coupled to the resistor 23 through the leftmost switch of the second set 26 and the rightmost switch of the third set 44 so that the gain of the system 20 has been reduced from its maximum. In particular, it has been reduced by the first of a series of possible gain-reduction steps that are realized with the first and second sets 25 and 26 of switches.

FIG. 2B illustrates the first in a series of steps that preferably occur as the system 20 proceeds from the switch settings of FIG. 2A to those of FIG. 2C. In this figure, two closed switches of the first set 25 are at opposite ends of a resistor segment 45 so that the resistance of the second resistor 42 has been coupled in parallel with the resistance of the resistor segment 45. In a system embodiment, the resistance of the second resistor 42 is selected to be much larger than the resistance of the resistor segment 45 (e.g., by at least a factor of 10) so that the resistance between the input and output ends of the resistor 23 is relatively unchanged.

The positions of the switches of FIGS. 2A-2C may be determined at each cycle of a clock that is provided to the system 20. At each clock pulse, only one switch of the third set 44 of switches is closed. Initially, it is the switch at the first end 33 of the second resistor 42 that is closed as shown in FIGS. 2A and 2B. In response to successive clock pulses, the closed switch progresses from the switch at the first end and moves towards the switch at the second end 34. Finally, it is the switch at the second end 34 of the second resistor 42 that is closed as shown in FIG. 2C. At this point in the process, the switch at the input end 31 of the resistor 23 is opened.

In FIG. 2C, the switch of the third set 44 that is closest to the second end 34 is now closed and all other switches of the third set are open. The switch of the first set 25 that is nearest the input end 31 is now opened and the process of moving from the initial amplifier gain in FIG. 2A to the final amplifier gain in FIG. 2C is complete. The switches of the third set 44 thus provide a number of intermediate gain steps between the switch states of FIGS. 2A and 2C.

Figure 3A:
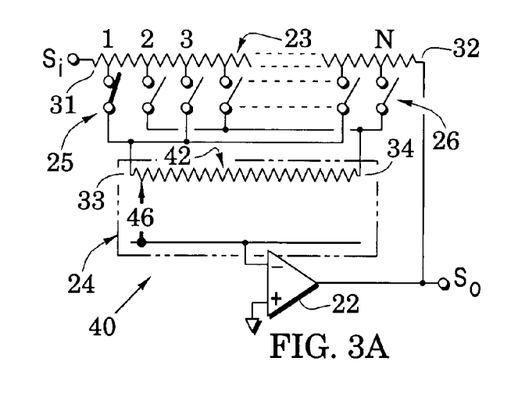
FIGS. 3A-3D are schematics that further illustrate the gain steps of FIGS. 2A-2C.
Figure 3B:
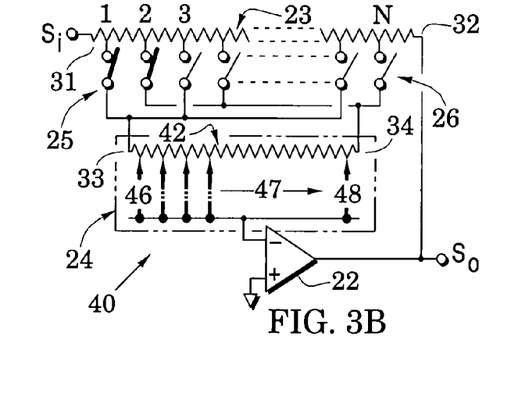
Figure 3C:
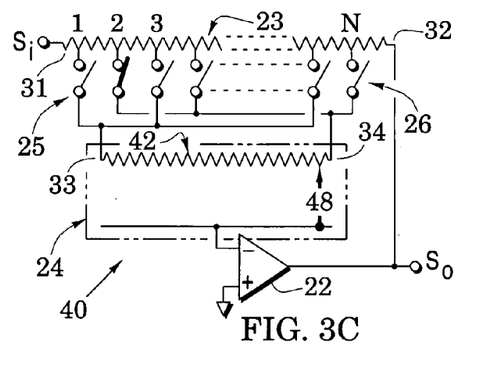
Figure 3D:
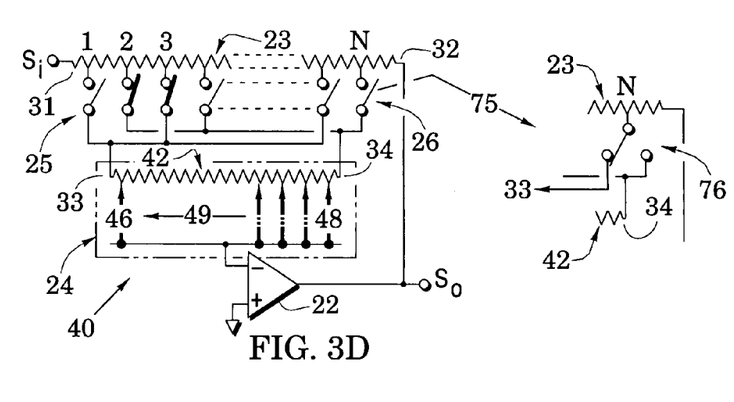

The gain adjustment processes of FIGS. 2A-2C may be easier to follow in FIGS. 3A-3D which include elements of FIGS. 2A-2C with like elements indicated by like reference numbers. In the latter figures, exemplary tap points 1, 2 and 3 are identified beginning at the input end 31 of the resistor 23. In addition, the third set (44 in FIGS. 2A-2C) of switches is represented as a potentiometer slider which slides along the second resistor 42. The switches of the first and second sets 25 and 26 are shown in FIGS. 3A, 3B and 3C to have the positions respectively shown in FIGS. 2A, 2B and 2C. Thus, the first potentiometer port 33 is connected to tap point 1 of the resistor 23 in FIGS. 3A and 3B and the second potentiometer port 34 is connected to tap point 2 of the resistor 23 in FIGS. 3B and 3C. In FIG. 3D, the second potentiometer port 34 continues to be connected to tap point 2 of the resistor 23 but the first potentiometer port 33 is now connected to tap point 3 of the resistor 23.

In FIG. 3A, the potentiometer slider is in position 46 at the first potentiometer port 33 so that it couples the inverting terminal of the amplifier 22 to the first tap point 1 on the resistor 23. In FIG. 3B, the slider slides, as indicated by transition arrow 47, through intermediate broken-line positions until reaching a terminal position 48 in which it couples the inverting input terminal of the amplifier 22 to the second tap point 2 on the resistor 23. In FIG. 3C, the switch at tap point 1 has been opened so that only the switch at tap point 2 is closed. FIGS. 3A-3C thus illustrate movement of the inverting terminal of the amplifier 22 from one tap point (tap point 1) to an adjacent tap point (tap point 2). This movement is realized by a plurality of small intermediate gain steps through the second resistor 42.

In FIG. 3D, the switch at tap point 3 has been closed and the slider reverses direction and slides, as indicated by transition arrow 49, through intermediate broken-line positions until reaching the terminal position 46 that was initially shown in FIG. 3A. The inverting terminal of the amplifier 22 has now been moved from tap point 2 to tap point 3. Although not shown in FIGS. 3A-3D, a final step would now open the switch at tap point 2 so that only the switch at tap point 3 is closed. Continuing the processes of FIGS. 3A-3D would move the inverting terminal of the amplifier 22 to a tap point N at the output end of the resistor 23 which represents the lowest-gain setting of the system 40. If the processes described above were reversed, the inverting terminal of the amplifier 22 would be moved back to tap point 1 at the input end of the resistor 23 (as in FIG. 3A) which represents the highest-gain setting of the system 40.

The processes of FIGS. 2A-2C and 3A-3D are especially useful in controlling volume of audio signals. For example, the system 20 of FIG. 1 can be used in an input portion of a codec (a device that converts analog audio signals into digital formats) that is used to effect playback and record functions in devices such as digital video disc (DVD) and compact disc (CD) recorders. As mentioned in the background section, zipper noise can occur when analog signals are quantized into digital signals that are then used to adjust the volume of an audio signal. Because of the resultant discreet gain jumps, the audio signals may be altered in large, instantaneous steps which can generate the objectionable zipper noise. Zipper noise manifests itself as a succession of annoying audio clicks or pops (ergo, the term zipper noise). By their nature, analog systems can smoothly transition between different amplitude levels and do not exhibit zipper noise.

This problem is significantly reduced, however, with use of the system 20 of FIG. 1 because of its unique structure. As described above, the first potentiometer port 33 can be coupled through the first set 25 of switches to first tap points spaced along the resistor 23 and the second potentiometer port 34 can be coupled through the second set 26 of switches to second tap points spaced along the resistor 23. In a significant feature of the system, the first and second tap points are interleaved which facilitates the oppositely-directed slider movements 47 and 49 that are shown in FIGS. 3B and 3D. These oppositely-directed slider movements occur as the inverting terminal of the amplifier 22 is successively moved from tap point 1 to tap point 2 and then to tap point 3. These fine gain adjustments substantially reduce or eliminate zipper noise. In a significant advantage, this reduction of zipper noise is realized with only a slight increase in circuit complexity and the use of expensive components (e.g., comparators and/or timeout circuitry) is avoided.

In FIGS. 2A, 2B and 2C, a current flows through the resistor 23 because of the difference between $S_i$ and $S_o$. In FIGS. 2A and 2C, there is substantially zero current in all of the switches of the sets 25, 26 and 44 because of the high input impedance of the amplifier. Although the impedance of the resistor segment 45 is much smaller than that of the second resistor 42, there will, however, be some current flow though the second resistor in FIG. 2B because it is now coupled in parallel with the resistor segment 45. Accordingly, there will be a small current through the switches at each side of this segment. If the switches are realized as transistors, they may carry a small amount of signal-dependent current which may cause a small amount of distortion in the system's audio signals. Such distortion, however, is momentary as it only occurs as the system transfers between tap points (e.g., the tap points 1-N shown in FIGS. 3A-3D. It is absent when the system is setting at a tap point so that distortion effects are substantially eliminated.

Various amplifier parameters (e.g., distortion, noise, common-mode rejection, supply rejection, and stability) of the system of FIGS. 2A-3D have been measured over various conditions (e.g., different element values, different supply voltages, different process variations, and different temperatures) and have been found to be well within desired ranges.

Figure 4:
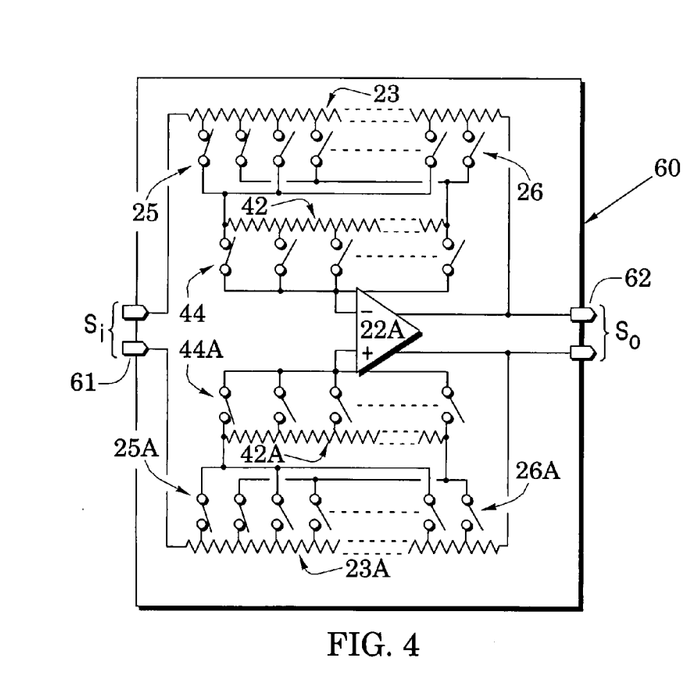
FIG. 4 is a schematic of a differential embodiment of the programmable-gain amplifier of FIGS. 1A-1C.

A differential embodiment 60 of the amplifier system of FIGS. 2A-2C and FIGS. 3A-3D is shown in FIG. 4 in which like elements are indicated by like reference numbers. In this embodiment, the resistor 23, first and second sets 25 and 26 of switches, the second resistor 42, and the third set 44 of switches are duplicated as a resistor 23A, first and second sets 25A and 26A of switches, a second resistor 42A, and a third set 44A of switches.

These duplicated elements are coupled between the lower input and output terminals of a fully-differential amplifier 22A which replaces the amplifier 22 of FIG. 2A. The system 60 receives a differential analog input signal $S_i$ at a differential input port 61 and provides a differential analog output signal $S_o$ at a differential output port 62.

In FIGS. 3A-3D, first and second sets 25 and 26 of switches are coupled to interleaved tap points along the resistor 23. Various other arrangements may be used. For example, the first set 25 of switches could be arranged to couple the first potentiometer port 33 to each tap point along the resistor 23 and the second set 26 of switches could also be arranged to couple the second potentiometer port 34 to each tap point. This arrangement permits the controller 28 of FIG. 1 to realize gain changes with various sequences of the tap points that would include the interleaved sequence illustrated in FIGS. 3A-3D. Yet another PGA system embodiment 70 is illustrated in FIG. 5.

System 70 includes elements of the system 20 of FIG. 1 with like elements indicated by like reference numbers. In the system embodiment 70, the electronic potentiometer 24 is realized with first and second transistors 71 and 72 that are coupled in series between the first and second potentiometer ports 33 and 34. In particular, the transistors 71 and 72 respectively have a current terminal coupled to the first and second potentiometer ports 33 and 34 with a second current terminal of each transistor coupled to the inverting terminal of the amplifier 22. Each of the transistors also has a control terminal coupled to receive a control signal from the controller (28 in FIG. 1).

Figure 5:
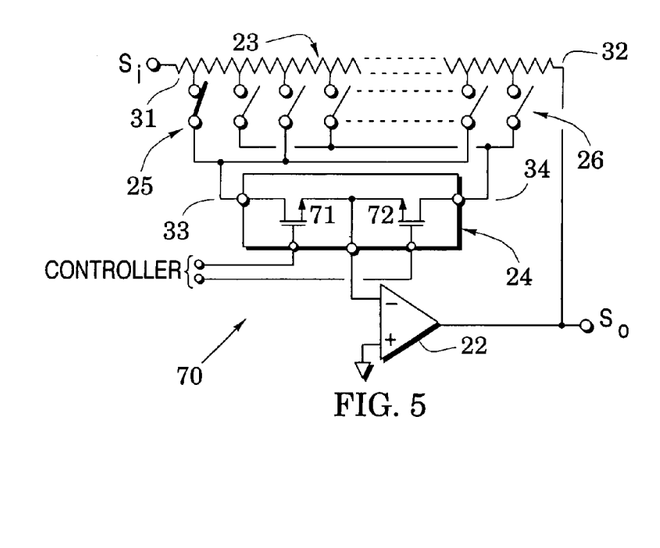
FIG. 5 is a schematic of another embodiment of the amplifier of FIG. 1.

Although they can be realized in other transistor structures in other system embodiments, the first and second transistors are shown as metal-oxide-semiconductor transistors in FIG. 5 with their sources coupled to the inverting terminal of the amplifier 22 and their with their gates receiving the control (i.e., bias) signals. The drain of transistor 71 is coupled to the first potentiometer port 33 and the drain of transistor 72 is coupled to the second potentiometer port 34. The control signals can be selected to bias the transistors below their saturation regions. In particular, they are biased into their triode regions where their drain currents are functions of their drain voltages (their sources being at virtual ground because of the high gain of the amplifier 22).

Accordingly, the transistors 71 and 72 act as variable resistors whose resistances are set by the control signals (from the controller 28 of FIG. 1) at their gates. By appropriately varying the gate signals of the transistors 71 and 72, the potentiometer slider actions of FIGS. 3A-3D can be realized. Although other embodiments may be used, the resistances of the transistors 71 and 72 can be controlled, in one embodiment, so that their sum between the first and second potentiometer ports is substantially constant. That is, their sum resistance corresponds to that of the second resistor 42 in FIGS. 3A-3D while the difference between their resistances produces the slider action along that resistor.

Attention is now returned to FIG. 3D to describe another system embodiment. As previously noted, the first potentiometer port 33 in FIG. 3D can be coupled (via switches of the first set 25) to selected ones of first tap points along the resistor 23 and the second potentiometer port 34 can be coupled (via switches of the second set 26) to selected ones of second tap points along the resistor 23 that are interleaved with the first tap points.

Replacement arrow 75 notes that the first and second sets 25 and 26 can be replaced, in other system embodiments, with a set 76 of switches wherein each of these switches is arranged to selectively couple a respective one of the tap points along the resistor 23 to either of the first and second potentiometer ports 33 and 34. The set 76 of switches may be used to enhance performance of PGA systems. For example, they may simplify the detailed design of the controller 28 of FIG. 1.

Figure 6A:
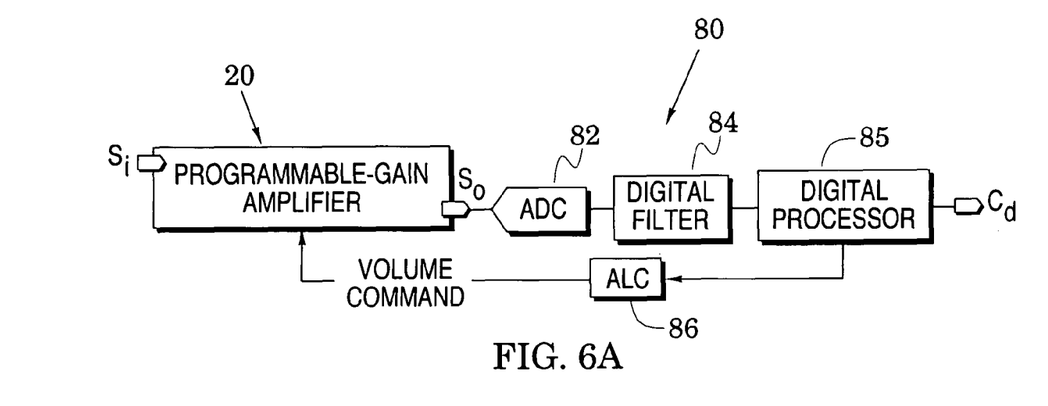
FIGS. 6A and 6B are schematics of control system embodiments that include programmable-gain amplifiers illustrated in FIGS. 1-5.
Figure 6B:
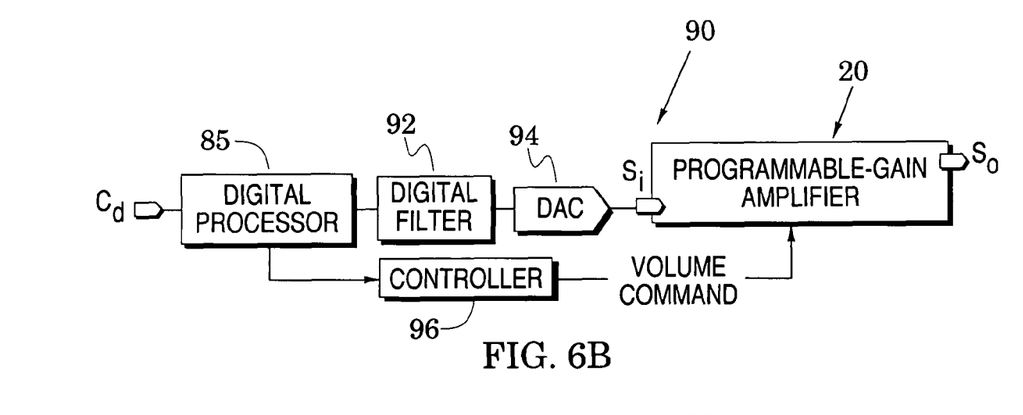

FIGS. 6A and 6B illustrate applications of the amplifier system 20 of FIG. 1 to form volume control structures that can be used in various audio processing systems (e.g., in audio codecs). FIG. 6A is directed to a control system 80 that processes an analog input signal $S_i$ into a digital code $C_d$. This system begins with the PGA system 20 of FIG. 1 and continues in serial order with an analog-to-digital converter (ADC) 82, a digital filter 84, and a digital processor 85.

In operation, the ADC 82 converts the analog output signal $S_o$ of the system 20 into a digital stream. The digital filter 84 may be configured to decimate (i.e., reduce) the clock rate of this digital stream to facilitate processing of the stream into the digital code $C_d$ by the processor 85. The processor also directs an automatic level control (ALC) 86 to provide a volume command which is fed back to adjust the gain of the of the amplifier system 20. This gain adjustment may be used, for example, to enhance the performance of the ADC 82 by maintaining the level of the analog output signal $S_o$ in a preferred amplitude window.

FIG. 6B is directed to an oppositely-directed control system 90 that processes a digital code $C_d$ into an analog output signal $S_o$. This system positions a digital filter 92 and a digital-to-analog converter (DAC) 94 between the processor 85 and the PGA system 20.

In operation, the digital filter 92 may be configured to interpolate (i.e., increase) the clock rate of the digital stream from the processor 85 to facilitate processing in the DAC 94 to thereby generate the analog input signal $S_i$ to the PGA system 20. The processor also directs a controller 96 which provides a volume command to adjust the gain of the of the amplifier system 20. This gain adjustment may be used, for example, to permit the output level to the DAC 94 to be urged into a preferred amplitude window.

The embodiments of the invention described herein are exemplary and numerous modifications, variations and rearrangements can be readily envisioned to achieve substantially equivalent results, all of which are intended to be embraced within the spirit and scope of the appended claims.

We claim:

1. A programmable-gain amplifier system to amplify an input signal into an output signal, comprising:
   an amplifier having input and output ports;
   a resistor having an input end to receive said input signal and an output end coupled to said output port;
   an electronic potentiometer configured to controllably provide selectable first and second resistances respectively between first and second potentiometer ports and said input port; and
   a first set of switches arranged to controllably couple said first potentiometer port to selected ones of first tap points along said resistor; and
   a second set of switches arranged to controllably couple said second potentiometer port to selected ones of second tap points along said resistor that are interleaved with said first tap points.

2. The system of claim 1, wherein said switches are transistors.

3. The system of claim 1, wherein said potentiometer includes:
   a second resistor coupled between said first and second potentiometer ports; and
   a third set of switches arranged to controllably couple said input port to any selected one of third tap points along said second resistor.

4. The system of claim 1, wherein said potentiometer includes first and second transistors respectively having first and second control terminals and respectively coupled between said first and second potentiometer ports and said input port to thereby provide said first and second resistances in response to bias signals at said first and second control terminals.

5. The system of claim 4, wherein said first and second transistors are metal-oxide-semiconductor transistors.

6. The system of claim 5, wherein said first and second control terminals are gates.

7. The system of claim 4, wherein said first and second resistances sum to a substantially-constant total.

8. The system of claim 1, wherein said amplifier has inverting and non-inverting input terminals and said input port is said inverting input terminal.

9. A programmable-gain amplifier system to amplify an input signal into an output signal, comprising:
   an amplifier having input and output terminals;
   a resistor having an input end to receive said input signal and an output end coupled to said output terminal;
   an electronic potentiometer configured to controllably provide selectable first and second resistances respectively between first and second potentiometer ports and said input terminal;
   a first set of transistors arranged to controllably couple said first potentiometer port to any selected one of first tap points along said resistor; and
   a second set of transistors arranged to controllably couple said second potentiometer port to any selected one of second tap points that are interleaved with said first tap points along said resistor.

10. The system of claim 9, wherein said potentiometer includes:
    a second resistor coupled between said first and second potentiometer ports; and
    a third set of transistors arranged to controllably couple said input port to any selected one of third tap points along said second resistor.

11. The system of claim 10, wherein the transistors of said first, second and third transistors are metal-oxide-semiconductor transistors.

12. The system of claim 9, wherein said potentiometer includes first and second transistors respectively having first and second control terminals and respectively coupled between said first and second potentiometer ports and said input terminal to thereby provide said first and second resistances in response to bias signals at said first and second control terminals.

13. The system of claim 9, wherein said first and second resistances sum to a substantially-constant total.

14. A control system to process an analog input signal into a digital code, comprising:
    a programmable-gain amplifier system that includes;
       an amplifier having input and output ports;
       a resistor having an input end to receive said input signal and an output end coupled to said output port;
       an electronic potentiometer configured to controllably provide selectable first and second resistances respectively between first and second potentiometer ports and said input port;
       a first set of switches arranged to controllably couple said first potentiometer port to any selected one of first tap points along said resistor; and
       a second set of switches arranged to controllably couple said second potentiometer port to any selected one of second tap points along said resistor;
    an analog-to-digital converter to convert a signal at said output port into a digital code;
    a decimator to reduce the sample rate of said digital code; and
    an automatic level control configured to command said first and second sets in response to said digital code;
    wherein said second tap points are interleaved with said first tap points.

15. The system of claim 14, wherein said potentiometer includes:
    a second resistor coupled between said first and second potentiometer ports; and
    a third set of switches arranged to controllably couple said input port to any selected one of third tap points along said second resistor.

16. The system of claim 14, wherein said potentiometer includes first and second transistors respectively having first and second control terminals and respectively coupled between said first and second potentiometer ports and said input port to thereby provide said first and second resistances in response to bias signals at said first and second control terminals.

17. The system of claim 16, wherein said first and second transistors are metal-oxide-semiconductor transistors.

* * * * *